United States Patent
Melanson

(10) Patent No.: US 7,199,744 B1
(45) Date of Patent: Apr. 3, 2007

(54) CIRCUITS AND METHODS FOR REDUCING INTERFERENCE FROM SWITCHED MODE CIRCUITS

(75) Inventor: John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 11/258,668

(22) Filed: Oct. 26, 2005

Related U.S. Application Data

(63) Continuation of application No. 10/715,950, filed on Nov. 18, 2003, now Pat. No. 7,010,271, which is a continuation of application No. 09/651,821, filed on Aug. 30, 2000, now abandoned.

(51) Int. Cl.
 *H03M 1/82* (2006.01)
(52) U.S. Cl. ............................. 341/152; 455/71; 455/68
(58) Field of Classification Search ................ 341/152, 341/143, 155, 126; 455/71, 68
See application file for complete search history.

(56) References Cited

U.S. PATENT DOCUMENTS

| | | | | |
|---|---|---|---|---|
| 4,233,685 A | * | 11/1980 | Taylor | 455/3.03 |
| 5,387,913 A | * | 2/1995 | Park et al. | 341/155 |
| 5,548,286 A | * | 8/1996 | Craven | 341/126 |
| 5,584,051 A | * | 12/1996 | Goken | 455/68 |
| 5,959,501 A | * | 9/1999 | Chester | 330/251 |
| 5,959,815 A | * | 9/1999 | Gilbert | 361/1 |
| 5,977,896 A | * | 11/1999 | Kohdaka et al. | 341/143 |
| 6,031,481 A | * | 2/2000 | Craven | 341/200 |
| 6,108,485 A | * | 8/2000 | Kim | 386/96 |
| 6,344,811 B1 | * | 2/2002 | Melanson | 341/143 |
| 6,563,893 B2 | * | 5/2003 | Smith et al. | 375/354 |
| 6,587,670 B1 | * | 7/2003 | Hoyt et al. | 455/71 |
| 6,965,335 B1 | * | 11/2005 | Trotter et al. | 341/152 |

* cited by examiner

*Primary Examiner*—Jean Bruner Jeanglaude
(74) *Attorney, Agent, or Firm*—James J. Murphy; Thompson & Knight, LLP

(57) ABSTRACT

A method of generating a pulse width modulated data stream includes providing a first clock signal having a first frequency and selecting a divisor from a set of divisors for dividing the first frequency to select a pattern rate of a pulse width modulated data stream and thereby shift in frequency noise generated at the pattern rate during pulse width modulation. The first frequency of the first signal is divided to generate a second signal at the selected pattern rate. Noise shaping and requantizing is performed on the second signal to generate a noise shaped and requantized second signal and the pulse width modulated data stream having patterns at the selected pattern rate is generated in response to the first signal and the noise shaped and requantized second signal.

20 Claims, 3 Drawing Sheets

CIRCUITS AND METHODS FOR REDUCING INTERFERENCE FROM SWITCHED MODE CIRCUITS

CROSS-REFERENCE TO RELATED APPLICATION

The present application is a continuation of U.S. application Ser. No. 10/715,950, filed Nov. 18, 2003 now U.S. Pat. No. 7,010,271, which is a continuation of U.S. patent application Ser. No. 09/651,821, filed Aug. 30, 2000 now abandoned.

This application is also related to U.S. Pat. No. 5,815,102 issued on Sep. 29, 1998 by inventor Melanson, and is incorporated herein by reference.

BACKGROUND OF THE INVENTION

1. Field of the Invention

The present invention relates in general to switched mode electronic circuits and in particular to circuits and methods for reducing interference from switched mode circuits.

2. Description of the Related Art

Class D audio power amplifiers (APAs) have been used for many years in systems, such wireline telephony, where high bandwidth is not critical. More recently however, new fabrication techniques, and in particular, new techniques for fabricating power transistors, have made integrated Class D APAs possible. This has extended their potential applications to lower-power, higher-bandwidth systems, including battery-powered portable music players and wireless communications devices.

One major advantage of Class D amplifiers is their efficiency. Generally, an audio signal is converted into a relatively high frequency stream of pulses varying in width with the amplitude of the audio signal. This pulse width modulated (PWM) signal is used to switch a set of power output transistors between cutoff and saturation which results in efficiencies above 90%. In contrast, the typical Class AB push-pull amplifier, using output transistors whose conduction varies linearly during each half-cycle, has an efficiency of around %60. The increased efficiency of Class D amplifiers in turn reduces power consumption and consequently lowers heat dissipation and improves battery life.

Similarly, switched mode power supplies have found wide acceptance in the design of compact electronic appliances. Among other things, switched mode power supplies advantageously use smaller transformers and are therefore typically more compact and lighter weight. This is in addition to the increased efficiency realized over linear power supplies. Moreover, the total number of components can be reduced to, for example, a power MOSFET die and a PWM controller die packaged together in a single package.

Given the importance of improved battery-life, reduced heat dissipation, and component size minimization in the design and construction of portable electronic appliances, improved switched mode techniques will have numerous practical advantages. The possible applications for these techniques are numerous, although Class D APAs and switched mode power supplies are two primary areas which should be considered.

SUMMARY OF THE INVENTION

According to the principles of the present invention, a system is disclosed which includes a radio receiver and switched mode circuitry operating at a selected switching frequency. Circuitry is included for setting the switching frequency of the switched mode circuitry 114/115 as a function of a frequency of a signal being received by the radio receiver.

The inventive concepts address one of the major disadvantages of conventional switched mode devices, namely, interference (noise) caused by the switching mechanism itself. This interference is of particular concern in systems employing radio receivers and similar interference sensitive circuitry. In accordance with the inventive principles, the switching frequency is shifted as a function of the radio frequency being received such that the switching frequency and its harmonics fall outside the frequency band of the received signal. Advantageously, these principles can be applied to different types of switched circuitry, including pulse width modulated power supplies and class D amplifiers.

BRIEF DESCRIPTION OF THE DRAWINGS

For a more complete understanding of the present invention, and the advantages thereof, reference is now made to the following descriptions taken in conjunction with the accompanying drawings, in which.

DESCRIPTION OF THE PREFERRED EMBODIMENTS

Figure 1:
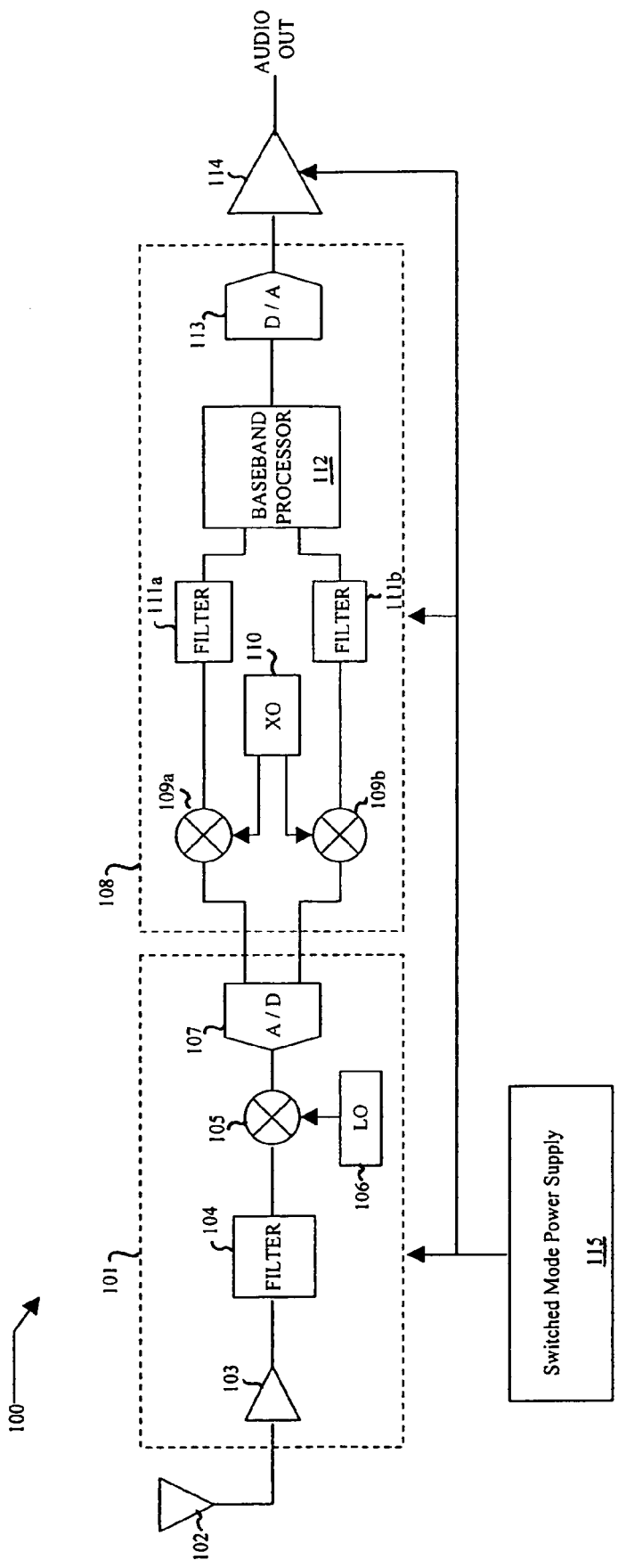
FIG. 1 is a diagram of one channel of a digital radio embodying the principles of the present invention.
Figure 2:
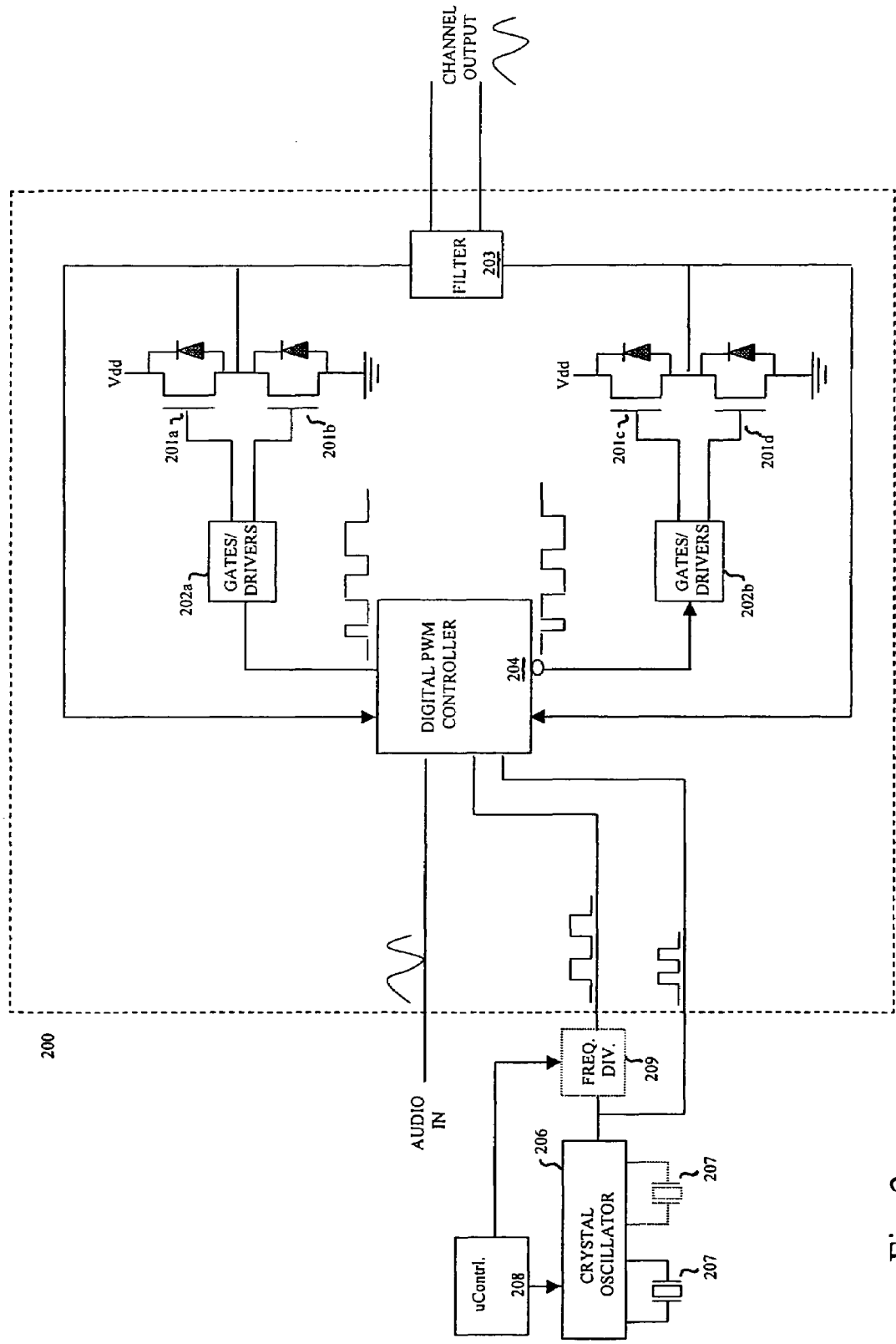
FIG. 2 is a diagram of a Class D pulse width modulated (PWM) amplifier suitable for use as audio power amplifier in the system of FIG. 1.
Figure 3:
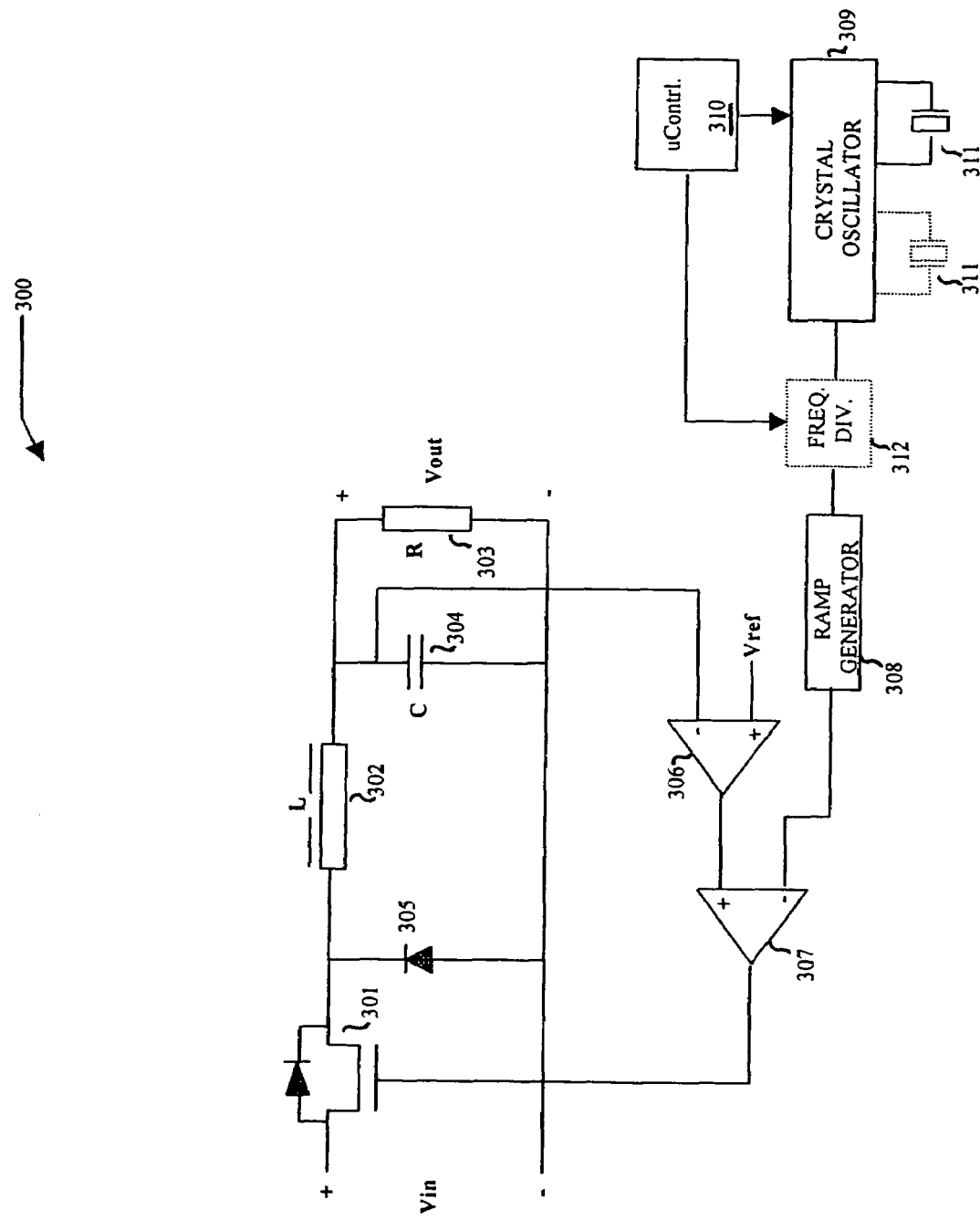
FIG. 3 is a diagram of a switched mode power supply for purposes of illustrating the inventive concepts.

The principles of the present invention and their advantages are best understood by referring to the illustrated embodiment depicted in FIGS. 1–3 of the drawings, in which like numbers designate like parts.

FIG. 1 is a functional block diagram of one channel of a digital radio 100 embodying the principles of the present invention. Digital radio 100 includes an analog section or front-end 101 which receives radio frequency (RF) signals from an associated antenna 102. Analog front-end 101 is preferably a conventional RF down-converter including a low noise amplifier (LNA) 103 for setting the system noise figure, a bandpass filter 104 and mixer 105 driven by an analog local oscillator 106. The mixed-down analog signal is then converted into digital form by analog to digital converter 107.

The digitized data output from A/D converter 107 is passed to digital processing section 108. A pair of mixers 109a,b generate in-phase (I) and quadrature (Q) signals from a corresponding pair of clock phases from crystal oscillator 110. The I and Q signals are next passed through bandpass filters 111a and 111b and on to digital baseband processor 112. The processed digital signal is then re-converted to analog (audio) form by D/A converter 113.

According to the principles of the present invention, a switched mode (Class D) audio power amplifier (APA) 114, discussed in detail below, is used to drive an external set of speakers or a headset. Preferably, at least some of the components of digital radio 100 are powered by a switched mode power supply (SMPS) 114. Power supply 114 will also be discussed further below.

One of the disadvantages of using conventional switched mode devices is the interference (radiated and conducted)

generated by the switching mechanism. This problem is of particular concern in compact electronic appliances which include a radio and similar audio circuits. For example, if the switching frequency is nominally at 350 kHz, harmonics will be generated at 700 kHz, 1050 kHz and 1400 kHz, all of which fall within the AM broadcast band. In order to insure that these signals do not interfere with radio reception, as well as preventing injection of noise into the system at other points, shielding and circuit isolation could be used. However, these alternatives are not practical in low cost and/or compact electronic appliances.

According to the inventive concepts, if radio 100 is receiving a signal near one of the harmonics of the switching frequency, the switching frequency is moved such that the resulting switching noise will not interfere with received signal. Assume that two possible switching signals A and B, used in either APA 114 or SMPS 115, or both, have base frequencies of 350 kHz and 380 kHz, respectively. (More than two signals can be used to provide a greater resolution). The corresponding harmonics are then:

| A (kHz) | B (kHz) |
|---------|---------|
| 700     | 760     |
| 1050    | 1140    |
| 1400    | 1520    |

One of the signals A and B is then selected as a function of the frequency of the received signal. In this example, where an AM radio is being assumed, the selection could be made as follows:

| Receive Freq. (kHz) | Switching Signal |
|---------------------|------------------|
| Under 730           | B                |
| 930–910             | A                |
| 910–1100            | B                |
| 1110–1280           | A                |
| 1290–1460           | B                |
| Above 1460          | A                |

As a result, the interference created by the switching signal and its harmonics are moved above or below the reception band, where their effect on noise performance is minimized.

In a digitally controlled system, the selection of the reception band is performed by a microcontroller or microprocessor which can accordingly also instruct the PWM control circuitry to change frequency. In the case of an analog oscillator, the PWM control circuitry can count the frequency of the local oscillator and choose the PWM frequency accordingly. The different switching frequencies can be generated using either an oscillator with multiple crystals or by frequency division.

FIG. 2 is a simplified functional block diagram of a Class D pulse width modulated (PWM) amplifier 200 suitable for use as APA 114 in one channel of system 100. It should be noted that a while a basic full-bridge amplifier is shown, other circuit designs may be used to practice the inventive concepts, including half-bridge Class D amplifiers.

In the full-bridge approach, four power MOSFETs 201a,d are used to drive the differential output from a single voltage supply Vdd under the control of gates and drivers 202a,b. In this embodiment, only one transistor of the upper transistor pair and one transistor of the lower transistor pair of MOSFETs is on and conducting in saturation while the other MOSFET in each pair is completely turned-off.

The gates/drivers 202a,b are controlled by a PWM modulated signal generated by digital PWM controller 204 which receives the analog audio signal Audio In, along with a high speed clock and a lower frequency clock, discussed below. PWM controller 204 also receives feedback from the outputs of the MOSFET pairs. PWM signal generation techniques are discussed in coassigned U.S. Pat. No. 5,815,102 to Melanson, entitled "Delta Sigma PWM DAC to Reduce Switching" and incorporated herein by reference. The result is a PWM signal having pulse widths proportional to the input signal amplitude. At the output, a low pass filter 203 is used to recover the amplified audio input signal.

According to the present inventive concepts, the frequency of low frequency clock (square wave) can be adjusted, as described above, such that the PWM switching signal driving the output MOSFETs (through gates/drivers 202) is shifted out of the reception band.

The inventive concepts provide at least two ways to generate a variable frequency square wave. (The options are generally indicated in the figures by dashed lines.) According to one embodiment, a crystal oscillator 206 selectively operates from one of a plurality of crystals 207 of differing resonance frequencies. A microcontroller 208, selects the crystal, and therefore the frequency, as a function of the selected receive frequency or frequency band. As indicated above, in a digital controlled radio, the receive frequency is known from the tuner selection and in an analog system from counting the LO. The primary advantage with this embodiment is that all the divide ratios remain the same.

According to the second embodiment, a programmable frequency divider 209 is used to generate multiple clock frequencies for driving digital PWM controller 204. Divider 209 could, for example, start with a base frequency of 512 fs, where fs is the sampling frequency used in the A/D conversion process, and divide by 64 to obtain a frequency of 8 fs. The resulting 64 time slots make it possible to generate PWM pulse widths from 0 to 64 periods wide. Similar, if the divide ratio is changed, for example, to 72, then 72 time slots are available modifying the switching frequency in the ratio of 8:9. Preferably, divider 209 is programmable. with the divide ratio selected by microcontroller 208 as a function of the received frequency.

As described in detail in U.S. Pat. No. 5,815,102, PWM controller 204 includes a delta-sigma modulator which quantizes the audio input stream and a duty cycle modulator which converts the resulting noise shaped quantized data stream into a duty-cycle encoded (pulse width modulated) data stream. A number of exemplary encoding schemes are described, including grow-left, grow-right, centered-grow-left, and centered-grow-right.

As shown in FIG. 2 herein, the divide ratio between the higher frequency clock signal output directly from oscillator 206 and the lower frequency clock signal output from divider 209 controls the operating behavior of PWM controller 204. Again, a change in the divide ratio changes the number of clock periods (slots) per PWM pattern output from PWM controller 204, and consequently changes the switching frequency of output transistors 201 a–201 d. Additionally, when the number of slots per PWM output pattern changes, the output pulse width representing the zero (0) input point also changes. For example, for a PWM output pattern having from 0 to 64 slots representing an input signal swinging between a maximum negative value and a maximum positive value, a PWM output pattern with zero (0) logic high slots (i.e. a zero percent duty cycle) represents the maximum negative input value, a PWM output pattern of 64 logic high slots (i.e. a one hundred percent duty cycle) represents the maximum positive input value, and a PWM output pattern with 32 logic high slots (i.e. a fifty percent duty cycle) represents an input value of zero (0). On the other hand, if the divide ratio changes to 72, and each PWM output pattern becomes 72 slots wide, then a PWM pattern with zero logic high slots represents the maximum negative input value, a PWM output pattern with 36 logic high slots represents an input value of zero, and a PWM output pattern of 72 logic high slots represents the maximum negative input value. In other words, while the output duty cycle for the zero input point remains constant at fifty-percent (50%) as the number of slots per output pattern changes, the number of active slots representing the zero input point does change.

Also described detail in U.S. Pat. No. 5,815,102 are techniques for compensating for the moving center gravity of a PWM signal being generated by PWM controller 209. Generally, the area under the output curve (i.e. the first integral) of a stream of PWM output patterns is directly proportional to the input stream, for either grow-right, grow-left, centered-grow-left or centered-grow-right patterns. However, the second integral of the curve representing that PWM output pattern stream (i.e. the center of gravity) shifts with changes in the input value stream, thereby introducing distortion. U.S. Pat. No. 5,815,102 provides a means for compensating for such second-order distortion in the PWM output with non-linear feedback to the delta-sigma modulator within PWM controller 204.

These concepts can also be applied to switched mode power supplies, such as SMPS 115 in system 100. A simplified functional diagram of a switched mode power supply 300 is shown in FIG. 3 for purposes of illustrating the inventive concepts. It should be noted that while the illustrated embodiment employs an analog ramp generator and analog comparator, that a digital PWM controller similar to that discussed above can also be instead used in SMPS 115.

SMPS 300 is based on a power MOSFET or semiconductor switch 301 driving an inductor 302 and output impedance 303. Inductor (core) 302 generally filters current ripple while a capacitor 304 is included for filtering voltage ripple. Free-wheeling diode 305 ensures that current is always flowing into inductor 302. A feedback loop is represented by differential error amplifier 306 which compares a feedback signal from the circuit output against a reference voltage Vref.

The output from error amplifier 306 is passed to the non-inverting input of modulator 307, the inverting input of which receives a triangle or sawtooth wave from ramp generator 308. As discussed above, the frequency of the square wave input into ramp generator 308 is varied depending on the frequency band of the received signal. Consequently, SWPS 300 also includes a crystal oscillator 309 controlled by a microcontroller 310. As indicated above, the inventive principles provide at least two ways in which the switching frequency can be changed. In one option, a plurality of crystals 311 of different resonance frequencies are provided, in which case all the divide ratios remain the same. In the second option, a programmable frequency divider 312 is used to generate multiple frequencies by dividing down a base frequency, as described above.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore, contemplated that the claims will cover any such modifications or embodiments that fall within the true scope of the invention.

What is claimed is:

1. A method of generating a pulse width modulated data stream comprising:
   providing a first clock signal having a first frequency;
   selecting a divisor from a set of divisors for dividing the first frequency to select a pattern rate of a pulse width modulated data stream and thereby shift in frequency noise generated at the pattern rate during pulse width modulation;
   dividing the first frequency of the first clock signal to generate a second clock signal at the selected pattern rate;
   noise shaping and requantizing the second clock signal to generate a noise shaped and requantized second clock signal; and
   generating the pulse width modulated data stream having patterns at the selected pattern rate in response to the first clock signal and the noise shaped and requantized second clock signal.

2. The method of claim 1, wherein selecting the divisor comprises selecting a divisor to shift in frequency noise generated during pulse width modulation out of a selected AM radio frequency band.

3. The method of claim 2, wherein selecting the divisor further comprises detecting the AM frequency band during tuning of an associated radio receiver.

4. The method of claim 1, further comprising generating a power supply voltage in response to the pulse width modulated data stream.

5. The method of claim 1, wherein the pulse width modulated data comprises audio data and the method further comprises driving a transistor bridge with the pulse width modulated signal for driving an audio output device.

6. The method of claim 1, wherein selecting the divisor comprises selecting the divisor in response to user control inputs.

7. A pulse width modulation system comprising:
   control circuitry for selecting a divisor from a set of divisors for dividing a first frequency of a first clock signal to select a pattern rate of a pulse width modulated data stream and thereby shift in frequency noise generated at the pattern rate during pulse width modulation;
   dividing circuitry for dividing the first frequency of the first clock signal to generate a second clock signal at the selected pattern rate;
   a delta-sigma modulator for noise shaping and requantizing the second clock signal to generate a noise shaped and requantized second clock signal; and
   a pulse width modulator stage for generating the pulse width modulated data stream having patterns at the selected pattern rate in response to the first clock signal and the noise shaped and requantized second clock signal.

8. The pulse width modulation system of claim 7, wherein the control circuitry is operable to select a divisor from the set of divisors in response to a user control input.

9. The pulse width modulation system of claim 7, wherein the control circuitry is operable to select a divisor from the set of divisors to shift in frequency noise generated during pulse width modulation out of a selected AM radio frequency band.

10. The pulse width modulation system of claim 7, further comprising frequency detection circuitry for detecting the AM frequency band during tuning of an associated radio receiver, wherein the control circuitry selects a divisor from the set of divisors in response to detection of the AM frequency band.

11. The pulse width modulation system of claim 7, further comprising circuitry for generating a power supply voltage from the pulse width modulated data stream.

12. The pulse width modulation system of claim 7, further comprising amplifier circuitry for driving a load in response to the pulse width modulated data stream.

13. The pulse width modulation system of claim 12, wherein the pulse width modulated data stream comprises audio data and the load comprises an audio output device.

14. The pulse width modulation system of claim 7, wherein the control circuitry comprises a microcontroller.

15. An AM radio system comprising:
control circuitry for selecting a divisor from a set of divisors for dividing a first frequency of a first clock signal to select a pattern rate of a pulse width modulated data stream and thereby shift in frequency noise generated at the pattern rate during pulse width modulation out of an AM frequency band to which an associated radio receiver is tuned;

dividing circuitry for dividing the first frequency of the first signal to generate a second signal at the selected pattern rate;

a delta-sigma modulator for noise shaping and requantizing the second signal to generate a noise shaped and requantized second signal; and a pulse width modulator stage for generating the pulse width modulated data stream having patterns at the selected pattern rate in response to the first signal and the noise shaped and requantized second signal.

16. The AM radio system of claim 15, further comprising power supply circuitry for generating a supply voltage in response to the pulse width modulated data stream.

17. The AM radio system of claim 15, further comprising driver circuitry for driving an audio output load with the pulse width modulated data stream.

18. The AM radio system of claim 17, wherein in the driver circuitry is selected from the group consisting of half-bridge and full-bridge driver circuits.

19. The method of claim 1, wherein noise shaping and requantizing the second signal to generate a noise shaped and requantized second signal comprises generating a noise shaped and requantized second signal having a rate which is twice the selected pattern rate.

20. The pulse width modulation system of claim 7, wherein the delta-sigma modulator generates a noise shaped and requantized second signal having rate which is twice the selected pattern rate.

* * * * *